(12) United States Patent  (10) Patent No.: US 6,713,333 B2
Mayuzumi  (45) Date of Patent: Mar. 30, 2004

(54) METHOD FOR FABRICATING A MOSFET

(75) Inventor: Satoru Mayuzumi, Tokyo (JP)

(73) Assignee: NEC Electronics Corporation (JP)

( * ) Notice: Subject to any disclaimer, the term of this patent is extended or adjusted under 35 U.S.C. 154(b) by 0 days.

(21) Appl. No.: 10/278,475

(22) Filed: Oct. 23, 2002

(65) Prior Publication Data

US 2003/0082861 A1 May 1, 2003

(30) Foreign Application Priority Data

Oct. 29, 2001 (JP) ........................................ 2001-331461

(51) Int. Cl.[7] ............................................. H01L 21/336
(52) U.S. Cl. ...................... 438/197; 438/286; 438/299; 438/303; 438/585; 438/981
(58) Field of Search ................................. 438/197, 286, 438/287, 289, 291, 299, 301, 302, 303, 305, 306, 307, 520, 525, 528, 585, 592, 595, 981

(56) References Cited

U.S. PATENT DOCUMENTS 6,229,184 B1 * 5/2001 Riccobene .................. 257/368

FOREIGN PATENT DOCUMENTS

| JP | 8-37296 | 2/1996 | ........... H01L/29/78 |
| JP | 10-064898 | 3/1998 | ......... H01L/21/316 |

* cited by examiner

*Primary Examiner*—Jack Chen
(74) *Attorney, Agent, or Firm*—Hayes Soloway P.C.

(57) ABSTRACT

The disclosed invention provides a method for fabricating a MOSFET comprising the steps of forming a first insulation layer over a semiconductor substrate; forming a trench which bottoms on the semiconductor substrate in the first insulation layer so that the semiconductor substrate is exposed at the bottom of the trench; injecting impurities selectively under at least one end of the exposed surface of the semiconductor substrate; forming a second insulation layer to cover the bottom surface of the trench by oxidizing the exposed surface of the semiconductor substrate; forming a gate electrode over the second insulation layer inside the trench; removing the first insulation layer; forming a drain region under the surface of the semiconductor substrate so that the drain region contacts with one end of the second insulation layer, the end under which the impurities were injected; and forming a source region under the surface of the semiconductor substrate so that the source region contacts with the other end of the second insulation layer, the end opposite to the end under which the impurities were injected.

8 Claims, 13 Drawing Sheets

DRAIN CURRENT
Id (A)

GATE VOLTAGE Vg (V)

METHOD FOR FABRICATING A MOSFET

BACKGROUND OF THE INVENTION

1. Field of the Invention

The present invention relates to a method for fabricating a metal oxide semiconductor field effect transistor (MOSFET) In particular, the invention relates to a method for fabricating a MOSFET, using a damascene process, with the aim of suppressing leakage current and enhancing a sub-threshold characteristic of the MOSFET.

2. Description of the Prior Art

A MOSFET fabricating technique using the damascene process to form a gate electrode has heretofore been known. This technique is disclosed in, for example, Kokai (Japanese Unexamined Patent Publication) No. Hei 8-37296 (No. 37296 of 1996). FIGS. 10A through 10C, 11A through 11C, and 12A through 12C are schematic cross-sectional diagrams illustrating sequential steps of fabricating a MOSFET by the above prior art.

As is shown in FIG. 10A, field oxide layers 102 for device isolation are first formed on a p-type silicon substrate 101. On the p-type silicon substrate 101, then, an insulation layer 103 into which n-type impurities are incorporated is formed. For the insulation layer 103, for example, a phosphor-silicate glass (PSG) film deposited up to a thickness of about 400 nm by low pressure-chemical vapor deposition (LP-CVD) is used.

Next, as is shown in FIG. 10B, a resist pattern 104 for forming a gate electrode on the insulation layer 103 is formed. This resist pattern 104 has an opening 104a that is formed in a part of a region above the region where the field oxide layers 102 are not present.

Then, as is shown in FIG. 10C, using the resist pattern 104 as a mask, the insulation layer 103 existing beneath the opening 104a is anisotropically etched and removed by a reactivity ion etching (RIE) process, so that the p-type silicon substrate 101 is exposed at the bottom of the opening 104a. Inconsequence, a trench 105 is formed in which a gate electrode will be embedded.

Next, as is shown in FIG. 11A, PSG is deposited over the entire surface of the silicon substrate 101 by the LP-CVD to form a PSG layer 106 with a thickness of about 100 nm. At this time, the phosphor (P) concentration in the PSG layer 106 is made lower than that in the insulation layer 103. Then, as is shown in FIG. 11B, by etching back the PSG layer 106, the PSG layer 106 portions at the bottom of the trench 105 and covering the insulation layer 103 are removed. In consequence, PSG layers for spacers 106a are formed on the side walls of the trench 105. Then, as is shown in FIG. 11C, a gate insulation layer 107 is formed on the surface of the p-type silicon substrate 101 in the bottom of the trench 105 by a thermal oxidation process.

Next, as is shown in FIG. 12A, by a thermomigration process, P is diffused from the insulation layer 103 and the PSG layers for spacers 106a, so that source/drain regions 108 are formed. The source/drain regions 108 each consist of an n+ layer 108a and an n− layer 108b. The n+ layer 108a is formed by the P diffusion from the insulation layer 103. The n− layer 108b is formed by the P diffusion from either PSG layer 106 for spacer.

Next, as in shown in FIG. 12B, material of low resistance such as tungsten (wolfram) (W) is deposited over the entire surface of the silicon substrate 101 to form a conductive layer 109 with a thickness of about 600 nm. Then, as is shown in FIG. 12C, by chemical mechanical polishing (CMP), the conductive layer 109, insulation layer 103, PSG layers 106a for spacers are polished so that they are partially removed and a planar top surface is created. In consequence, a damascene gate electrode 109 a made of W is formed. In the manner described above, a MOSFET is fabricated.

With this technique disclosed in the above-mentioned Kokai No. Hei 8-37296, however, there are the following two problems. A first problem is that leakage current called a gate induced drain leakage (GIDL) current occurs in the end of the drain region. This occurs due to a strong electric field generated between the gate electrode and the end of the drain region; in other words, a tunneling phenomenon gives rise to the leakage current. In up-to-date MOSFETs, the gate insulation layer becomes thinner as smaller devices are required. This results in generating a strong electric field between the gate electrode and the end of the drain region and the GIDL occurrence becomes more significant.

A second problem is that the thickness of the gate insulation layer near a field oxide layer is made thinner and this causes a hump in a sub-threshold characteristic of the device. FIG. 13 is a cross-sectional view of a MOSFET fabricated by the prior art method in which a gate electrode is located to partially contact with a field oxide layer. FIG. 14 is a graph representing a sub-threshold characteristic of the MOSFET shown in FIG. 13 with gate voltages plotted on the abscissa and drain currents on the ordinate. The reason why a hump occurs in the sub-threshold characteristic of the device will be explained below, using FIGS. 13 and 14. In FIG. 13, components corresponding to those shown in FIGS. 10 through 12 are assigned the same reference numbers and their detailed explanation is not repeated.

As is shown in FIG. 13, in the MOSFET having a field oxide layer 102 formed, using shallow trench isolation (STI), a dent 111 called a divot is sometimes made at the end of the STI layer 110. This is due to that the STI layer is etched during a resist stripping process or the like. The corner of the silicon substrate 101 adjacent to the field oxide layer 102 is rounded and the gate insulation layer 107 formed by thermal oxidation becomes thinner at this corner.

For the MOSFET having the gate insulation layer 107 that is partially thinner, a hump occurs in its sub-threshold characteristic. That is, a very small current tends to flow through it even if the gate voltage is lower than its threshold voltage. In the graph of FIG. 14, a solid line 112 represents the sub-threshold characteristic of the MOSFET without a hump occurring and a dotted line 113 represents the sub-threshold characteristic of the MOSFET with a hump occurring. As is apparent in FIG. 14, the sub-threshold characteristic with a hump is inferior to that without a hump and lowers the turn-on performance of the MOSFET. This phenomenon appears significantly for a static random access memory (SRAM) or the like using relatively short transistors.

Meanwhile, Kokai (Japanese Unexamined Patent Publication) No. Hei 10-64898 (No. 64898 of 1998) discloses a technique in which halogen ions are implanted in the surface layer or silicon layer of a silicon substrate and then a gate oxide layer is formed by performing a heating process. According to this disclosure, the implanted halogen accelerates silicon oxidation so that a thicker and uniform oxide layer can be formed. Also, Kokai (Japanese Unexamined Patent Publication) No. Hei 11-354648 (No. 354648 of 1999) and Kokai (Japanese Unexamined Patent Publication) No. 2001-237324 disclose a technique in which halogen or inert gas ions are implanted in the surface layer of a silicon substrate and then a gate oxide layer is formed by a heating process. According to this disclosure, because the implanted ions can accelerate oxidation reaction, the thickness of the gate oxide layer can be controlled by adjusting the quantity of the ions to be implanted. To solve the above-noted problems, therefore, it is conceivable to form a thicker gate oxide layer, using these techniques.

However, a problem associated with the above-mentioned prior art techniques is as follows: making the gate insulation layer thicker causes a decrease in the MOSFET operation speed and an increase in its power consumption and makes it difficult to develop a smaller MOSFET.

BRIEF SUMMARY OF THE INVENTION

SUMMARY OF THE INVENTION

The present invention provides a method for fabricating a MOSFET comprising the steps of forming a first insulation layer over a semiconductor substrate; forming a trench which bottoms on the semiconductor substrate in the first insulation layer so that the semiconductor substrate is exposed at the bottom of the trench; injecting impurities selectively under at least one end of the exposed surface of the semiconductor substrate; forming a second insulation layer to cover the bottom surface of the trench by oxidizing the exposed surface of the semiconductor substrate; forming a gate electrode over the second insulation layer inside the trench; removing the first insulation layer; forming a drain region under the surface of the semiconductor substrate so that the drain region contacts with one end of the second insulation layer, the end under which the impurities were injected; and forming a source region under the surface of the semiconductor substrate so that the source region contacts with the other end of the second insulation layer, the end opposite to the end under which the impurities were injected.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Figure 1:
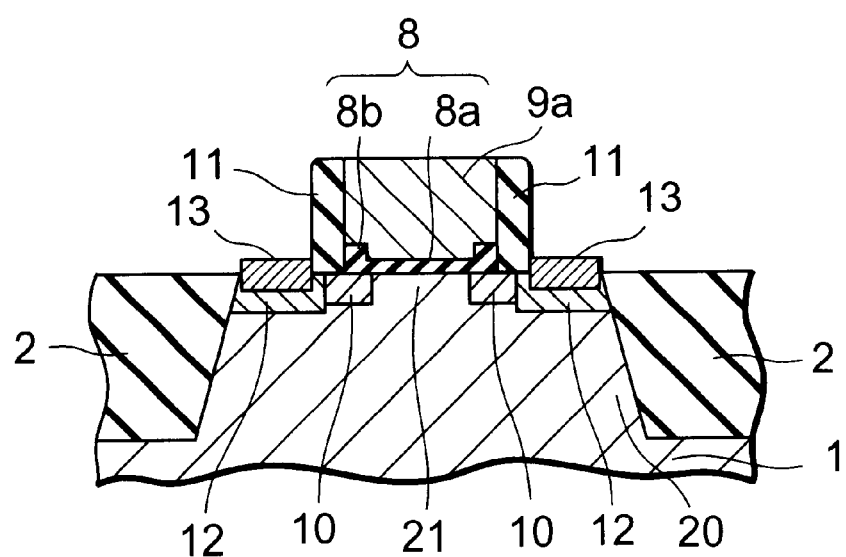
FIG. 1 is a cross-sectional view of a MOSFET fabricated, according to a preferred Embodiment 1 of the present invention.

The present invention now is described fully hereinafter with reference to the accompanying drawings in which preferred embodiments of the invention are shown. First, a preferred Embodiment 1 of the invention is described. FIG. 1 is a cross-sectional view of a MOSFET fabricated, according to Embodiment 1 of the invention. As is shown in FIG. 1, in Embodiment 1, a MOSFET is fabricated on a p-type silicon (Si) substrate 1 and device isolation layers 2 are embedded in position with their top surfaces being flush with the surface of the Si substrate 1. The device isolation layers 2 are formed by shallow trench isolation (STI), each consisting of a plasma oxide film or the like. A region where a device should be formed is between two device isolation layers 2 forming the boundaries on the surface of the Si substrate 1 and this region is, for example, a region for transistor formation 20 in this embodiment. In the region for transistor formation 20, there are two diffusion layer regions 12, each being contiguous with each device isolation layer 2. Lightly doped drain (LDD) regions are adjacent to one end of each diffusion layer region 12 whose other end is contiguous with each device isolation layer 2. Impurities of the appropriate type are implanted in the diffusion layer regions 12 and LDD regions 10. The concentration of the impurities in the diffusion layer regions 12 is higher than that in the LDD regions 10. In the region for transistor formation 20, there is a channel region 21 between the LDD regions 10. One diffusion layer region 12 coupled to one LDD region 10 and the other diffusion layer region 12 coupled to the other LDD region 10 make source/drain regions and this pair of source/drain regions is located opposite to each other across the channel region 21.

A gate insulation layer 8 is laid covering the top of the channel region 21 and partially covering the tops of the LDD regions 10. The gate insulation layer 8 consists of, for example, a SiO2 and SiON laminated or SiO2 and Si3N4 laminated film. The gate insulation layer 8 is thinner in its middle portion 8a and thicker in its both ends 8b nearer to the device isolation layers 2, that is, the portions covering the tops of the LDD regions 10. The thickness of the gate insulation layer 8 in the middle portion 8a is, for example, 1.5 to 3.0 nm and the thickness in the ends 8b is, for example, in the order of 0.3 to 0.8 nm thicker than that in the middle portion 8a. Over the gate insulation layer 8, there is a gate electrode 9a made of material such as W, Ti, or Al. There are side walls 11 on either sides of the gate insulation layer 8 and gate electrode 9a. Each side wall 11 consists of, for example, a single layer or a plurality of layers of insulation film made of SiO2, Si3N4, or the like. Moreover, silicide regions 13 are laid partially covering the tops of the diffusion layer regions 12, resulting from the reaction of the Si substrate 1 with a metal having a high melting point, such as T1, Co, or Ni.

Figure 2A:
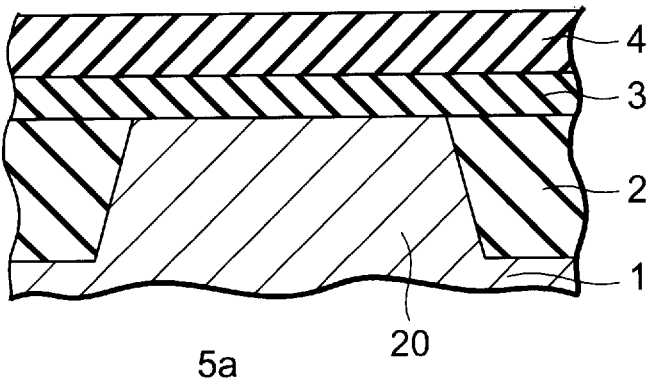
FIGS. 2A through 2C are schematic cross-sectional diagrams illustrating sequential steps of fabricating a MOSFET by the method of Embodiment 1.

Then, a method for fabricating a MOSFET in Embodiment 1 will be explained. FIGS. 2A through 2C, 3A through 3C, 4A through 4Cl, and 5A through 5C are schematic cross-sectional diagrams illustrating sequential steps of fabricating the MOSFET by the method of Embodiment 1. As is shown in FIG. 2A, device isolation layers 2 are first formed in position so that their top surfaces will be flush with the surface of the p-type silicon (Si) substrate 1, which form the boundaries of the region for transistor formation 20. In this case, each device isolation layer 2 is formed by STI, consisting of a plasma oxide film or the like. Impurities of the appropriate type are implanted in the region for transistor formation 20 to create a well. Then, an insulation layer 3 is formed over the entire surface of the Si substrate 1 and an insulation layer 4 is formed over the insulation layer 3. At this time, the insulation layer 3 is made of, for example, Si3N4 or the like and its thickness should be, for example, about 50 nm. The insulation layer 4 is made of, for example, SiO2, PSG, BPSG, or the like and its thickness should be, for example, about 250 nm.

Figure 2B:
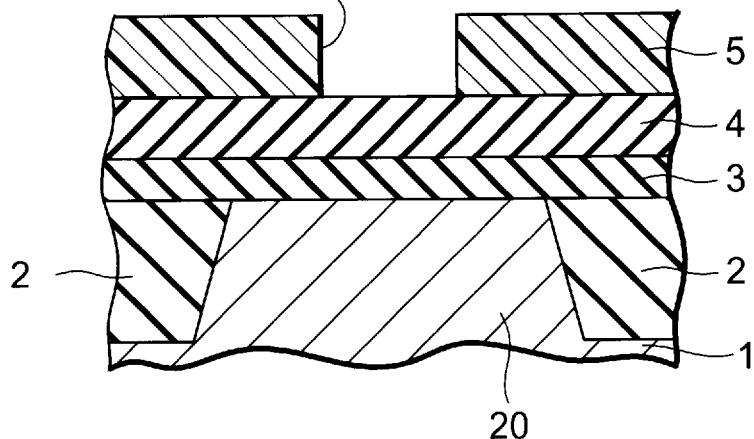

Next, as is shown in FIG. 2B, a resist pattern 5 for gate electrode formation is formed over the insulation layer 4. The resist pattern 5 has an opening 5a that is formed in a part of a region just above the region for transistor formation 20. This opening 5a is formed in a region where a gate insulation layer and a gate electrode will be formed in a later step.

Figure 2C:
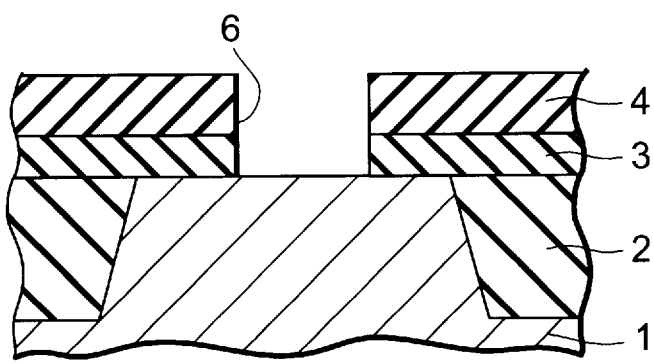

Then, as is shown in FIG. 2C, using the resist pattern 5 as a mask, the insulation layer 4 and the insulation layer 3 are anisotropically etched by a reactivity ion etching (RIE) process. In consequence, the insulation layer 4 and the insulation layer 3 are selectively removed and a trench 6 in which a gate electrode will be embedded is formed in the region beneath the opening 5a. The trench 6 bottoms on the Si substrate 1 and the Si substrate 1 is exposed at the bottom of the trench 6. The width of the trench 6 determines the gate dimensions and, in Embodiment 1, it should be, for example, about 150 nm. Then, the resist pattern 5 is removed.

Figure 3A:
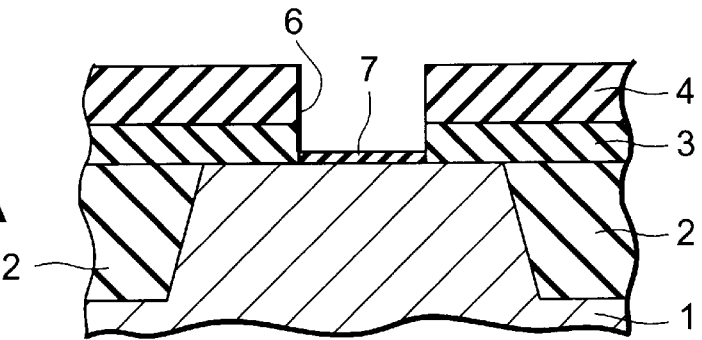
FIGS. 3A through 3C are schematic cross-sectional diagrams illustrating sequential steps of fabricating a MOSFET by the method of Embodiment 1, following the steps in FIG. 2.

Next, as is shown in FIG. 3A, an insulation layer 7 is formed at the bottom of the trench 6 by oxidizing or nitrifying the Si substrate in the bottom of the trench 6, using a thermal oxidation process. In this case, the insulation layer 7 is made of, for example, SiO2, Si3N4, or the like and its thickness should be, for example, about 10 nm.

Figure 3B:
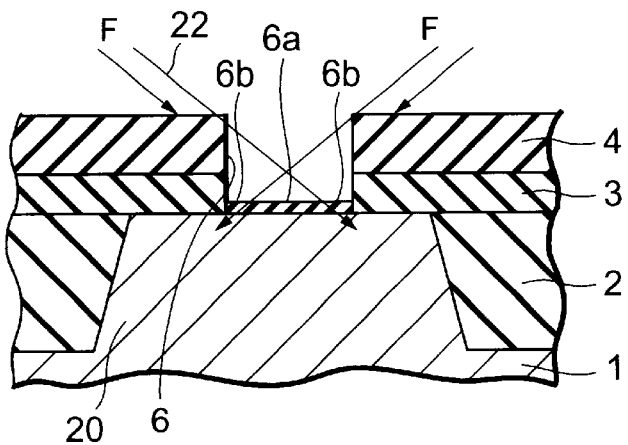
Figure 3C:
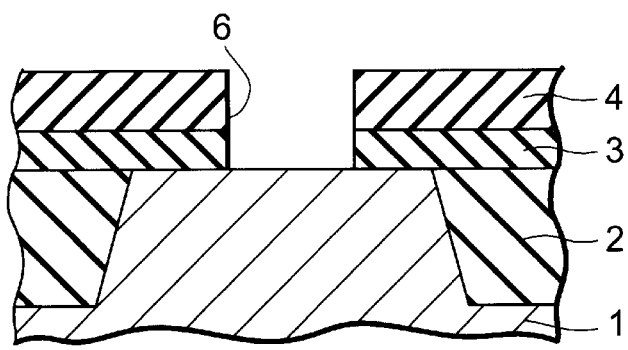

Then, as is shown in FIG. 3B, fluorine (F) ions as impurities are implanted in the substrate under the trench 6. At this time, the F ions should be injected in a direction 22 at an angle between the direction perpendicular to the surface of the Si substrate 1 and the horizontal direction in the figure, that is, the direction from the channel region 21 (see FIG. 1) toward each diffusion layer region 12 (see FIG. 1). Consequently, the insulation layers 3 and 4 function as a mask and the F ions can be injected only under both ends 6b of the bottom surface of the trench 6. Therefore, the F ions are not injected under the middle portion 6a of the bottom of the trench 6. For example, if the total thickness of the insulation layers 3 and 4 is 300 nm and the width of the trench 6 is 150 nm, by injecting the F ions in the direction 22 at an angle of 45 degrees with regard to a direction perpendicular to the surface of the Si substrate 1, the insulation layers 3 and 4 function as a mask and the F ions can be injected only under a pair of the ends 6b of the bottom surface of the trench 6, wherein the ends are nearer to the device isolation layers 2. In consequence, the F ions passing through the insulation layer 7 are implanted in the Si substrate 1 only in the regions beneath the pair of the ends 6b. At this time, the energy of the F ions to be implanted should be in the order of 10 to 20 keV and the quantity of the F ions should be in the order of $1 \times 10^{14}$ to $1 \times 10^{15}$ cm$^{-3}$. Instead of fluorine F, Si, Argon (Ar), or any halide element may be used as the impurities to be implanted. Implantation of the ions of any of the above-mentioned substances in the Si substrate produces an effect of increasing the rate at which the material is oxidized by thermal oxidation. Then, the insulation layer 7 is removed, as is shown in FIG. 3C.

Figure 4A:
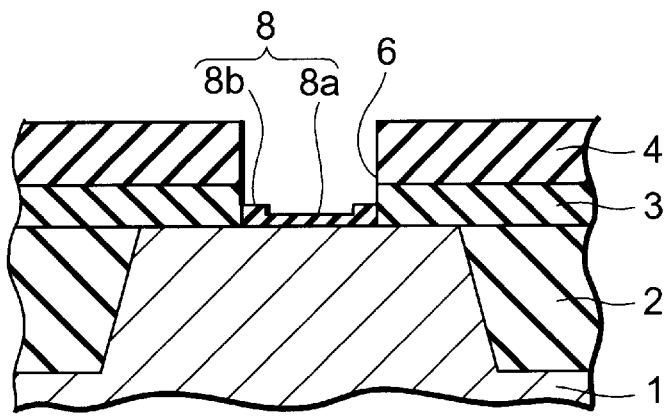
FIGS. 4A through 4C are schematic cross-sectional diagrams illustrating sequential steps of fabricating a MOSFET by the method of Embodiment 1, following the steps in FIG. 3.

Next, as is shown in FIG. 4A, a gate insulation layer 8 is formed at the bottom of the trench 6 by oxidizing the surface of the Si substrate in the bottom of the trench 6, using the thermal oxidation process. At this time, in the Si substrate portions in which the impurity ions were implanted in the step shown in FIG. 3B, the oxidation reaction is accelerated by the implanted impurities and this makes the gate insulation layer 8 thicker in these portions. Because the impurity ions have been injected only under the ends 6b of the trench 6 in the step shown in FIG. 3B, the thickness of the gate insulation layer 8 in its ends 8b corresponding to the ends 6b of the bottom of the trench 6 is thicker than that in its middle portion 8a corresponding to the middle portion 6a of the bottom of the trench 6. The gate insulation layer 8 consists of, for example, a SiO2 and SiON laminated or SiO2 and Si3N4 laminated film. Its thickness in the middle portion 8a should be in the order of 1.5 to 3.0 nm. Assuming that the above-mentioned quantity of the F ions have been implanted, the thickness of the insulation layer 8 in its ends 8b corresponding to the regions in which the F ions were implanted is thicker in the order of 0.3 to 0.8 nm than that in the middle portion 8a under which the F ions were not injected.

Figure 4B:
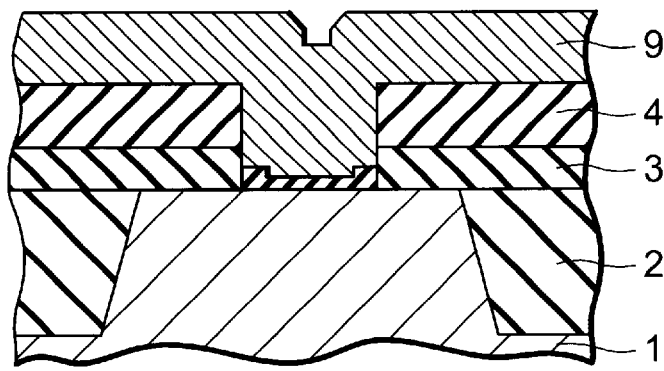
Figure 4C:
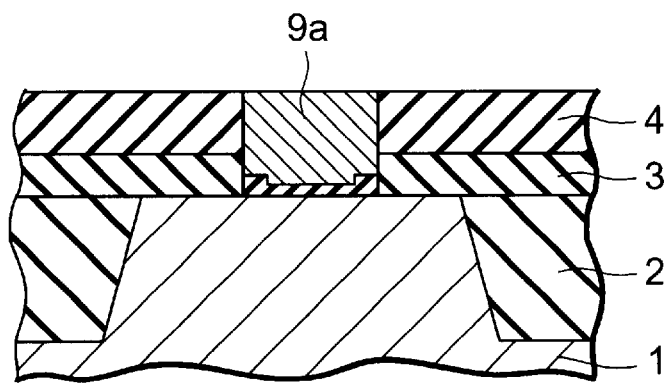

Next, as is shown in FIG. 4B, a conductive layer 9 made of a low resistance material is formed over the insulation layer 4 and the insulation layer 8. Its thickness should be, for example, about 500 nm. The low resistance material is, for example, W, Ti, Al, or the like. Then, as is shown in FIG. 4C, by chemical mechanical polishing (CMP), the conductive layer 9 and the insulation layer 4 are polished so that they are partially removed and a gate electrode 9a is formed inside the trench 6.

Figure 5A:
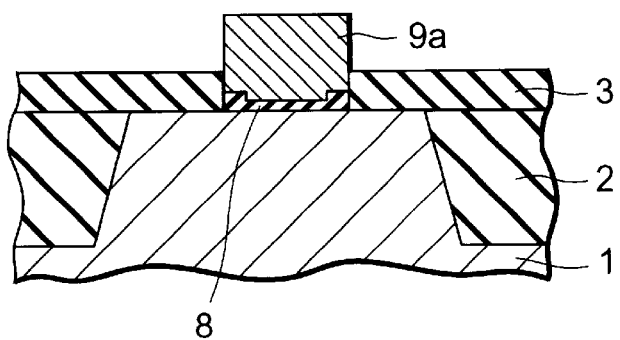
FIGS. 5A through 5C are schematic cross-sectional diagrams illustrating sequential steps of fabricating a MOSFET by the method of Embodiment 1, following the steps in FIG. 4.

Next, as is shown in FIG. 5A, the insulation layer 4 is removed by the RIE process or a wet etching process. In this case, the conditions for etching the insulation layer 4 should be set not to etch the insulation layer 3 so that the insulation layer 3 remains.

Figure 5B:
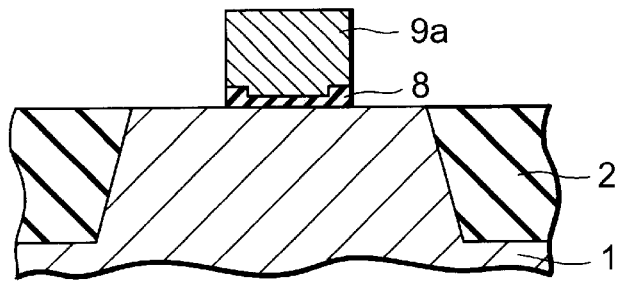

Then, as is shown in FIG. 5B, the insulation layer 3 is removed by the RIE or wet etching process so that the surfaces of the Si substrate 1 and the device isolation layers 2 are exposed. In this case, the conditions for etching the insulation layer 3 should be set not to etch the device isolation layers 2 and the gate insulation layer 8.

Figure 5C:
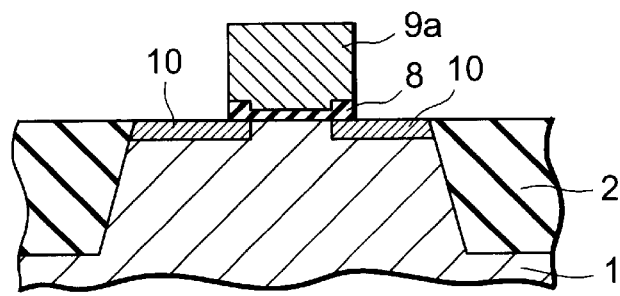

Next, as is shown in FIG. 5C, the LDD regions 10 are formed under the exposed surfaces of the Si substrate 1 in such a way that impurity ions are injected under the exposed portions of the Si substrate 1 in a direction at an angle with respect to a direction perpendicular to the surface of the Si substrate 1. Then, ion implantation is performed if necessary to form a pocket region (not shown) to prevent a punch through or the like.

Next, as is shown in FIG. 1, the side walls 11 are formed in such a way that, after the entire surface of the Si substrate is covered with a single layer or a plurality of layers of insulation film made of SiO2, Si3N4, or the like, the insulation film is etched back so that it remains only on either sides of the gate electrode 9a and the gate insulation layer 8. Then, the diffusion layer regions 12 are formed by implanting impurity ions in regions that are not under the side walls 11 within the LDD regions 10. Consequently, the impurity concentration in the diffusion layer regions 12 is higher than that in the LDD regions 10. One diffusion layer region 12 coupled to one LDD region 10 and the other diffusion layer region 12 coupled to the other LDD region 10 make source/drain regions. Then, a metal having a high melting point, such as T1, Co, or Ni, is deposited on the tops of the diffusion layer regions 12. By heating the metal to make it react with Si, the material of the surfaces of the diffusion layer regions 12, the silicide regions 13 are formed. In the manner described above, the MOSFET structure relevant to Embodiment 1, shown in FIG. 1, is fabricated.

According to Embodiment 1, in the step shown in FIG. 3B, by injecting the F ions into the substrate under the trench 6 along the angled direction 22, the F ions can be injected only under the ends 6b of the bottom of the trench 6. The ends are nearer to the regions where the diffusion layer regions 12 (see FIG. 1) will be formed. In consequence, because the F ions accelerate Si oxidation in the step shown in FIG. 4A, the insulation layer 8 can be formed with the thickness in its ends 8b is thicker than the thickness in its middle portion 8a. As a result, because the thickness of the insulation layer 8 in its middle portion 8a is thinner, the high-speed performance of the MOSFET is not lowered, while keeping low power consumption. Because the thickness of the insulation layer 8 in its ends 8b is thicker, leakage current between the gate electrode and the drain region can be prevented.

In Embodiment 1, the thickness of the insulation layer 8 is made thicker in its both ends that are nearer to the source/drain regions; that is, both the ends 8b are thicker than the middle portion 8a. This is because there is a possibility of either of the source/drain regions functioning as the drain region, according to the direction in which voltage is applied between the source/drain regions. If the drain region is fixed to either of the source/drain regions, only one end of the insulation layer 8, the end adjacent to the drain region, may be made thicker.

Figure 6:
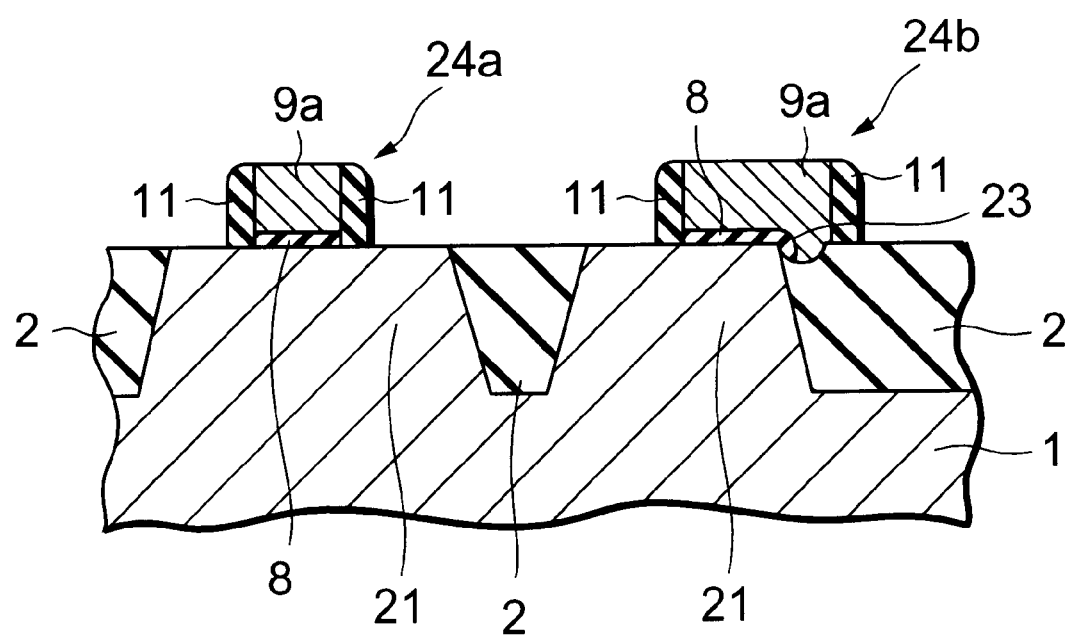
FIG. 6 is a cross-sectional view of a MOSFET fabricated, according to a preferred Embodiment 2 of the present invention.

Then, a preferred Embodiment 2 of the invention is described. FIG. 6 is a cross-sectional view of a MOSFET fabricated, according to Embodiment 2 of the invention. In Embodiment 2, components corresponding to those mentioned in the foregoing Embodiment 1 are assigned the same reference numbers and their detailed explanation is not repeated. As is shown in FIG. 6, in the MOSFET relevant to Embodiment 2, device isolation layers 2 are formed in position with their top surfaces being flush with the surface of the Si substrate 1, which form the boundaries between regions for device formation. In two adjacent regions for device formation, individual transistors 24a and 24b are fabricated. While FIG. 1 is the cross-sectional view representing a section of the MOSFET structure parallel to the direction in which the source-drain current flows, FIG. 6 is the cross-sectional view representing a section of the MOSFET structure intersecting orthogonally the direction in which the source-drain current flows. In FIG. 6, therefore, the source/drain regions are not shown, as they are located in front of and behind the transistors.

For the transistor 24a, the gate insulation layer 8 is laid over the channel region 21. The thickness of the gate insulation layer 8 is uniform; for example, 1.5 to 3.0 nm. The structure of the transistor 24a is the same as that of the MOSFET relevant to the foregoing Embodiment 1 except those noted above.

The transistor 24b is positioned across the boundary between the SI substrate 1 and the device isolation layer 2 shown at the right. On the boundary between the channel region 21 and the device isolation layer 2, a dent 23 that is a divot is formed. The gate insulation layer 8 of the transistor 24b is laid on the Si substrate 1 with its thickness not reduced even in its end extending inside the dent 23. That is, the thickness of the gate insulation layer 8 inside the dent 23 is equal to or greater than the thickness in its middle portion. The structure of the transistor 24b is the same as that of the transistor 24a except those noted above.

Figure 7A:
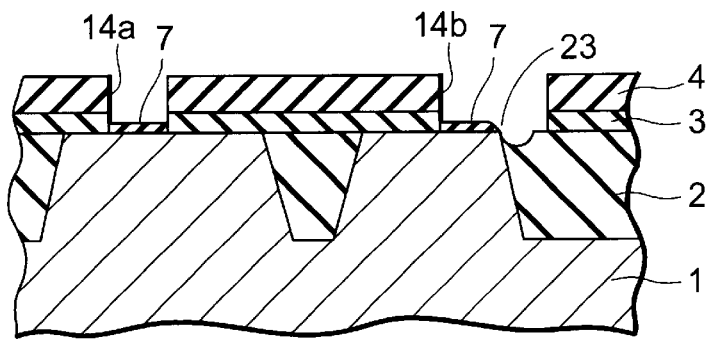
FIGS. 7A through 7C are schematic cross-sectional diagrams illustrating sequential steps of fabricating a MOSFET by the method of Embodiment 2.

Then, a method for fabricating a MOSFET in Embodiment 2 will be explained. FIGS. 7A through 7C and 8A through 8C are schematic cross-sectional diagrams illustrating sequential steps of fabricating the MOSFET by the method of Embodiment 2. As is shown in FIG. 7A, a plurality of device isolation layers 2 are first formed in position so that their top surfaces will be flush with the surface of the p-type Si substrate 1. After impurities of the appropriate type are implanted to create a well, an insulation layer 3 is formed to cover the Si substrate land the device isolation layers 2 and an insulation layer 4 is formed over the insulation layer 3. Then, a resist pattern (not shown) is formed over the insulation layer 4. Using the resist pattern as a mask, the insulation layer 4 and the insulation layer 3 are anisotropically etched by the RIE process and selectively removed. In consequence, trenches 14a and 14b are formed. Then, insulation layers 7 are formed at the bottoms of the trenches 14a and 14b. In Embodiment 2, the trench 14a is positioned at a given distance from the device isolation layer 2 shown at the left and the Si substrate 1 is exposed at the bottom of the trench 14a. The trench 14b is positioned across the boundary between the Si substrate 1 and the device isolation layer 2 at the right. The Si substrate 1 and the device isolation layer 2 are exposed at the bottom of the trench 14b. The width of the trench 14a should be, for example, about 150 nm. The width of the trench 14b should be determined so that the length of the Si substrate 1 exposed inside the trench 14b will be in the order of 150 nm. The insulation layers 3, 4, and 7 are formed to be the same in dimensions and material as the corresponding ones mentioned in Embodiment 1. Furthermore, on the surface of the device isolation layer 2 at the left, the dent 23 is formed at a corner adjacent to the Si substrate 1 by etching the device isolation layer 2.

Figure 7B:
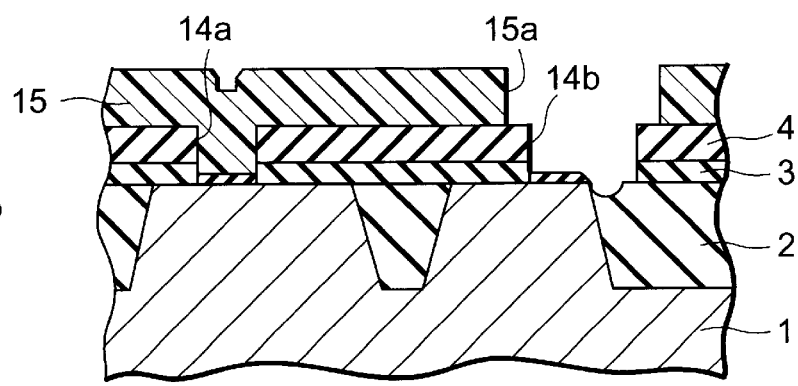

Next, as is shown in FIG. 7B, a resist pattern 15 is formed over the insulation layer 4. The resist pattern 15 covers the trench 14a and has an opening 15a above the trench 14b. The width of the opening 15a should be larger than the width of the trench 14b so that the opening 15a includes the trench 14b when viewed from a point right above the surface of the Si substrate 1.

Figure 7C:
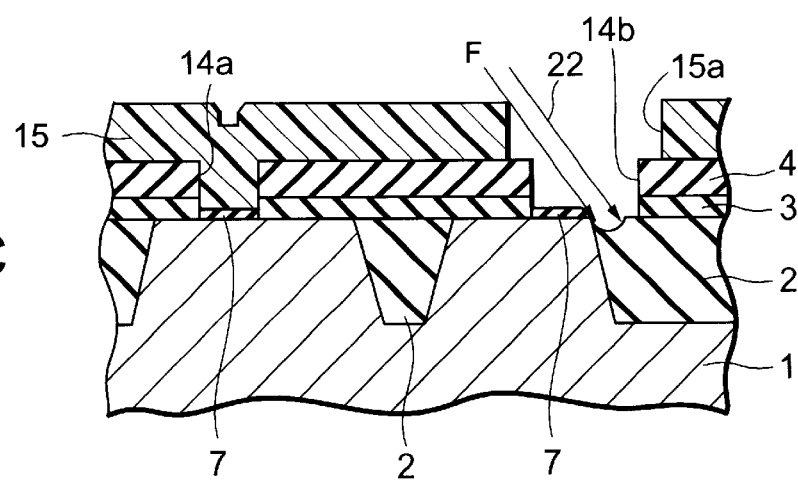

Then, as is shown in FIG. 7C, F ions are injected under the bottom of the trench 14b in a direction at an angle. In consequence, the F ions can be implanted in the Si substrate 1 under the insulation layer 7 only in a region contiguous with the device isolation layer 2 at the bottom of the trench 14b. In this case, for example, if the width of the opening 15a is larger than the sum of the width of the trench 14b and the thickness of the resist pattern 15, the direction 22 in which the F ions are injected should be set at an angle of 45 degrees with respect to a direction perpendicular to the surface of the Si substrate 1. The energy and quantity of the F ions to be implanted, for example, maybe the same as specified in the foregoing Embodiment 1.

Figure 8A:
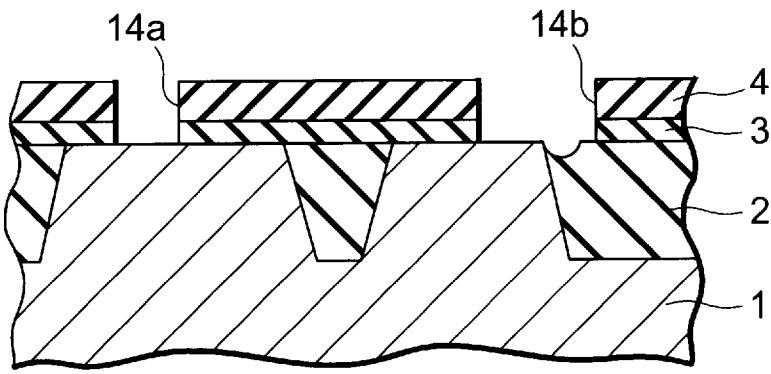
FIGS. 8A through 8C are schematic cross-sectional diagrams illustrating sequential steps of fabricating a MOSFET by the method of Embodiment 2, following the steps in FIG. 7.
Figure 8B:
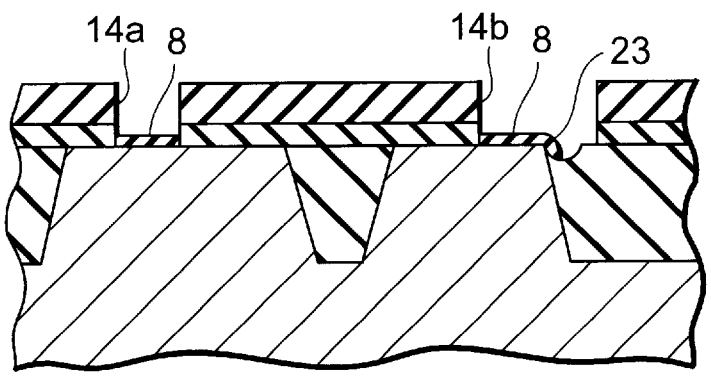

Next, as is shown in FIG. 8A, the resist pattern 15 and the insulation layer 7 (see FIG. 7C) are removed. Then, as is shown in FIG. 8B, a gate insulation layer 8 is formed by a thermal oxidation process. In this case, as the gate insulation layer 8, for example, the same one as the gate insulation layer 8 of the MOSFET in the foregoing Embodiment 1 is formed. At this time, in the Si substrate 1 region in which the F ions were implanted in the step shown in FIG. 7C, the Si oxidation reaction is accelerated. Thus, the thickness of the insulation layer 8 does not decrease even inside the dent 23.

Figure 8C:
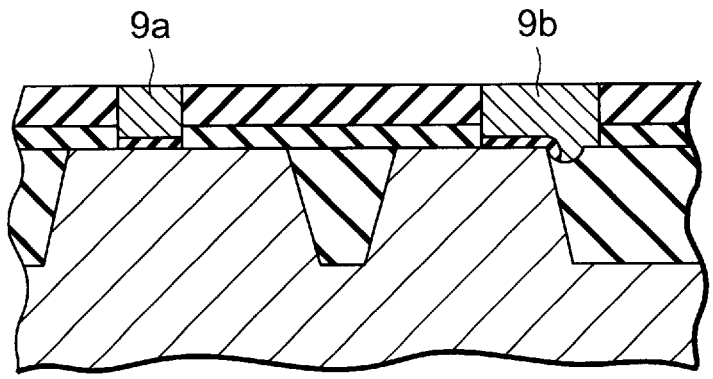

Then, as is shown in FIG. 8C, gate electrodes 9a and 9b are formed in the trenches 14a and 14b, respectively. Then, LDD regions, side walls, diffusion layer regions, and silicide regions are formed in the same way as illustrated in FIGS. 5A through 5C of the foregoing Embodiment 1. In the manner described above, The MOSFET shown in FIG. 6 is fabricated.

In Embodiment 2, by injecting the F ions under the bottom of the trench 14b in the angled direction 22 in the step shown in FIG. 7C, the F ions can be implanted in the Si substrate 1 region under the bottom of the trench 14b only in a region contiguous with the device isolation layer 2. In consequence, because the implanted F ions accelerate the Si oxidation in the step shown in FIG. 8B, the thickness of the insulation layer 8 does not decrease even in the region where the Si substrate 1 under the bottom of the trench 14b is contiguous with the device isolation layer 2, that is, the region where the dent 23 is formed. Therefore, the insulation layer 8 need not be made thicker and a hump in the sub-threshold characteristic of the device can be prevented.

Figure 9A:
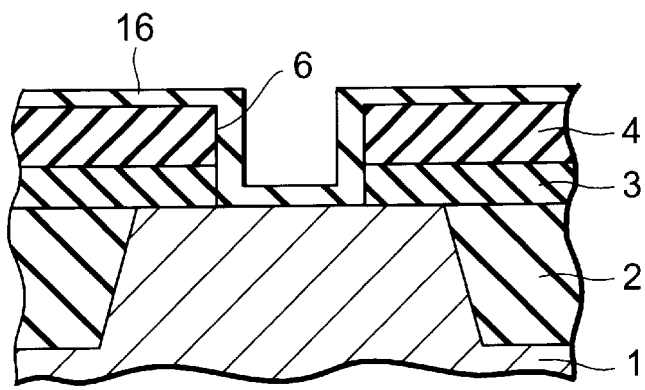
FIGS. 9A and 9B are schematic cross-sectional diagrams illustrating sequential steps of fabricating a MOSFET by the method of a preferred Embodiment 3 of the present invention.
Figure 9B:
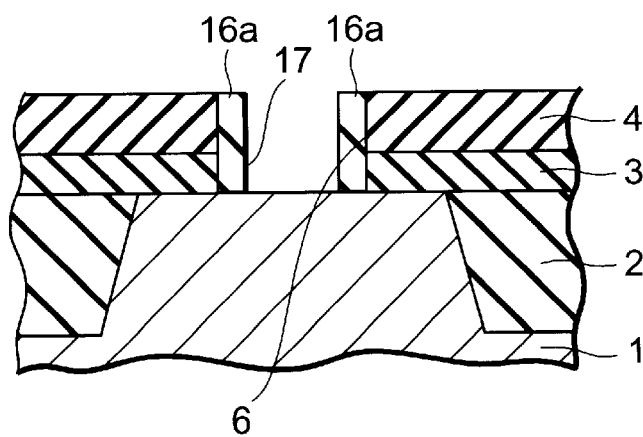
Figure 10A:
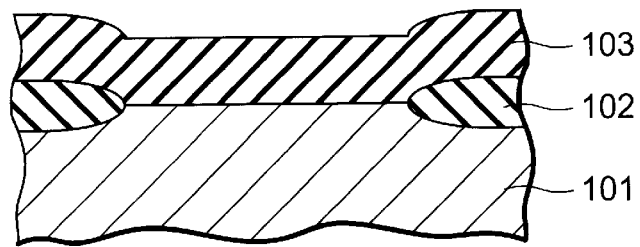
FIGS. 10A through 10C are schematic cross-sectional diagrams illustrating sequential steps of fabricating a MOSFET by a prior art method.
Figure 10B:
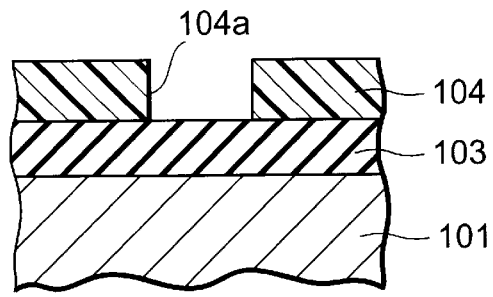
Figure 10C:
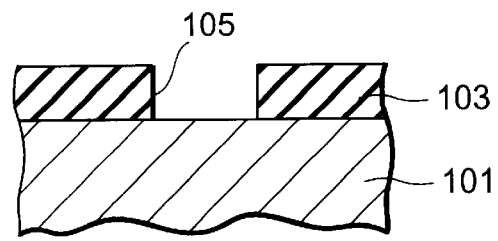
Figure 11A:
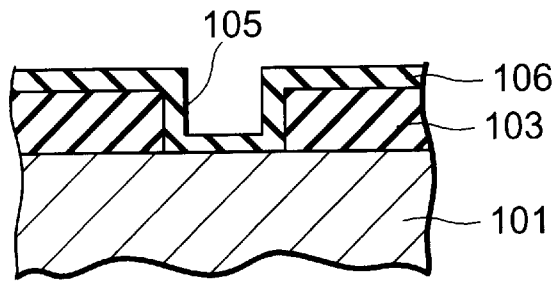
FIGS. 11A through 11C are schematic cross-sectional diagrams illustrating sequential steps of fabricating a MOSFET by the prior art method, following the steps in FIG. 10.
Figure 11B:
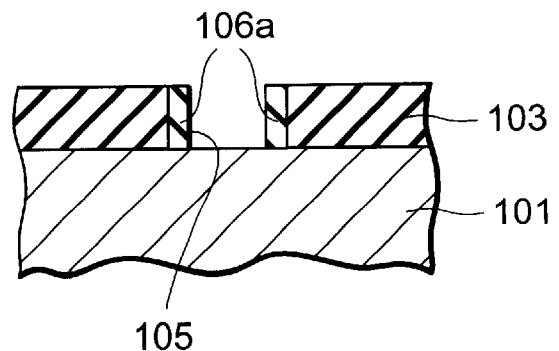
Figure 11C:
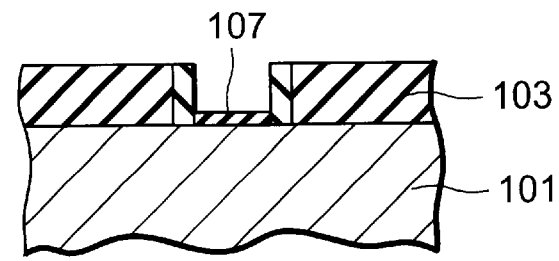
Figure 12A:
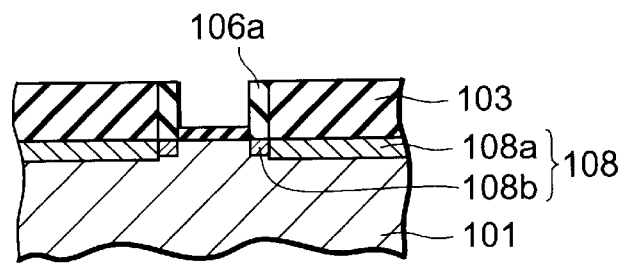
FIGS. 12A through 12C are schematic cross-sectional diagrams illustrating sequential steps of fabricating a MOSFET by the prior art method, following the steps in FIG. 11.
Figure 12B:
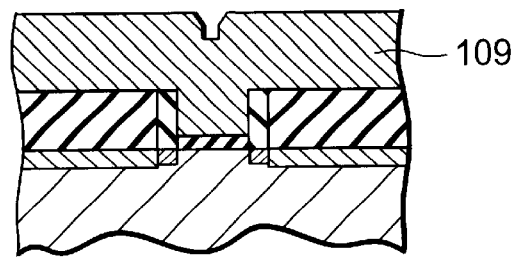
Figure 12C:
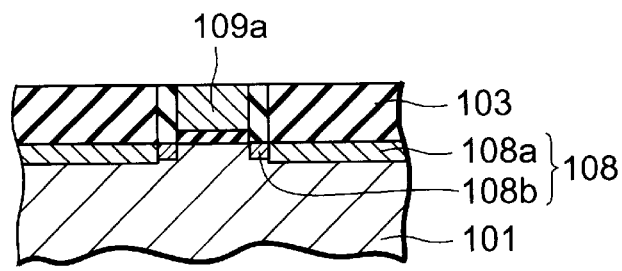
Figure 13:
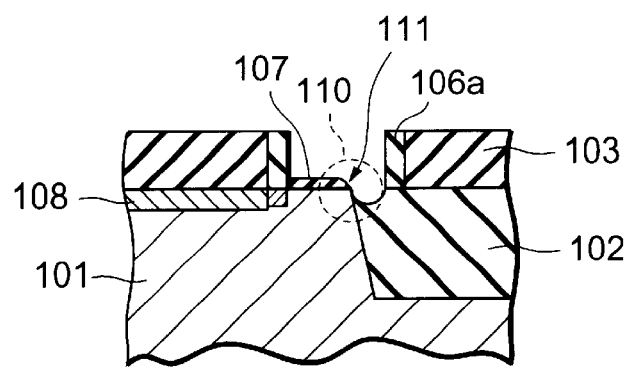
FIG. 13 is a cross-sectional view of a MOSFET fabricated by the prior art method in which a gate electrode is located to partially contact with a field oxide layer.
Figure 14:
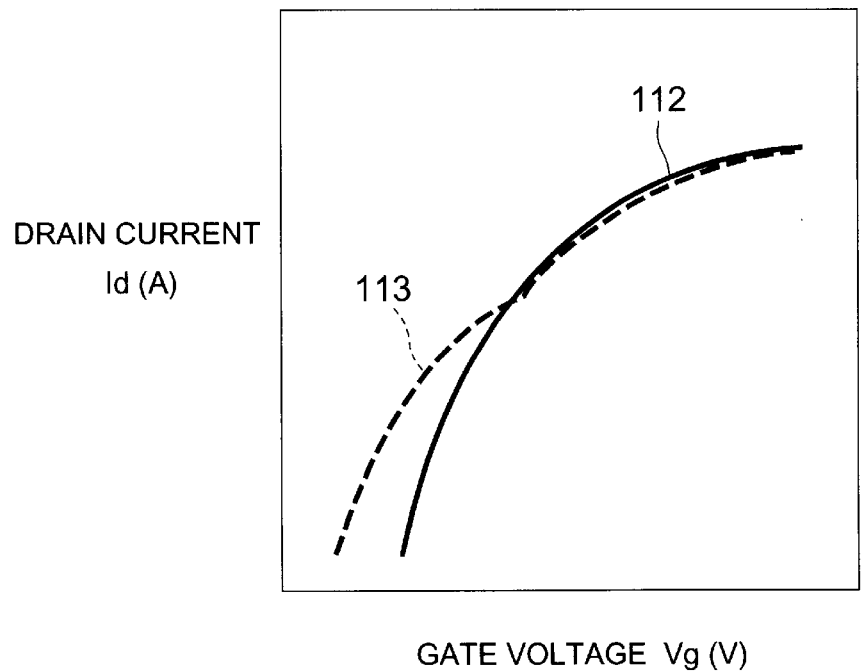
FIG. 14 is a graph representing a sub-threshold characteristic of the MOSFET shown in FIG. 13 with gate voltages plotted on the abscissa and drain currents on the ordinate.

Then, a preferred Embodiment 3 of the invention is described. The structure of a MOSFET to be fabricated by Embodiment 3 is the same as that of the MOSFET (see FIG. 1) fabricated by the foregoing Embodiment 1. Now, a method for fabricating a MOSFET in Embodiment 3 will be explained. FIGS. 9A and 9B are schematic cross-sectional diagrams illustrating sequential steps of fabricating the MOSFET by the method of Embodiment 3. First, insulation layers 3 and 4 are formed over the Si substrate 1 and a trench 6 is formed in the insulation layers 3 and 4 in the same way as illustrated in FIGS. 2A through 2C of the foregoing Embodiment 1.

Next, as is shown in FIG. 9A, an insulation layer 16 is formed over the insulation layer 4 and inside the trench 6 by a low pressure chemical vapor deposition (LP-CVD) process. The insulation layer 16 consists of, for example, a film of SiO2, Si3N4, PSG, or the like and its thickness should be, for example, about 100 nm.

Then, as is shown in FIG. 9, by etching back the insulation layer 16, the insulation layer 16 formed over the insulation layer 4 and the insulation layer 16 formed at the bottom of the trench 6 are removed and spacers 16a are formed on the side walls of the trench 6. In consequence, a trench 17 for gate electrode formation is formed.

In the same way illustrated in FIGS. 3A through 3C, 4A through 4C, and 5A through 5C of the foregoing Embodiment 1, after forming an insulation layer at the bottom of the trench 17, F ions are injected only under the ends of the bottom of the trench 17 by injection in an angled direction. Then, after removing the insulation layer, agate insulation layer is formed by a thermal oxidation process at the bottom of the trench 17. Then, a conductive layer is embedded in the trench 17 and a planar top surface is created by CMP. In consequence, a gate electrode is formed inside the trench 17 through the damascene process. Then, the insulation layers 4 and 3 are etched and removed and the LDD regions, diffusion layer regions, and silicide regions are formed. In this manner, the MOSFET relevant to Embodiment 3 is fabricated. The method of Embodiment 3 can apply to the foregoing Embodiment 2.

While two insulation layers 3 and 4 are formed over the Si substrate 1 in the foregoing Embodiments 1 through 3, a signal layer of insulation may be laid over the substrate in the present invention. In the latter case, the insulation layer to be formed is made of, for example, SiO2, Si3N4, or the like and its thickness should be, for example, about 300 nm.

Although an inorganic insulation film made of SiO2 or the like is used as the gate insulation layer 8 in the foregoing Embodiments 1 through 3, it may be possible to form the gate insulation layer in this way: after forming the inorganic insulation film made of SiO2 or the like, a film of high permittivity (High-k film) is formed and a laminated film is formed as the gate insulation layer. In this case, the High-k film is made of, for example, ZrO2, HfO2, Ta2O5, Al2O3, or the like through the CVD process or the like. Its thickness to grow is adjusted so that the thickness for electrical insulation will be in the order of 1.5 to 2.5 nm.

Although a metal such as W, Al, or Ti was mentioned as the examples of low resistance material of the gate electrode in the foregoing Embodiments 1 through 3, instead of the metal, other low resistance material may be used for the gate electrode, including TiN, SiGe, a polycrystalline silicon film or a silicide film (Wsi, TiSi, or the like) or a laminated film of these substances.

As described in detail hereinbefore, the present invention makes it possible to produce a MOSFET having the following advantages. The electric field between the gate electrode and the drain end is mitigated and leakage current can be prevented in the MOSFET. The high-speed performance of the MOSFET is not lowered, while keeping low power consumption. Furthermore, the disclosed method avoids reduction in the thickness of the gate insulation layer in its portion contacting with the STI and can prevent a hump in the sub-threshold characteristic of the MOSFET.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A method for fabricating a MOSFET comprising the steps of:
   forming a first insulation layer over a semiconductor substrate;
   selectively forming a trench in said first insulation layer to define a part of said semiconductor substrate as a gate formation region, said gate formation region having a central portion and end portions sandwiching said central portion;
   injecting oxidation enhancing impurities into said end portions of said gate formation region while suppressing injection of said oxidation enhancing impurities into said central portion of said gate formation region;

forming a second insulation layer on said gate formation region, said second insulation layer thereby having a first part on said central portion of said gate formation region and second parts on said end portions of said gate forming region which are larger in thickness than said first part;

forming a gate electrode on said second insulation layer; and forming source and drain regions by using said gate electrode as a mask so that each of said source and drain regions is formed in contact with an associated one of said end parts of said second insulation layer.

2. A method for fabricating a MOSFET as recited in claim 1, wherein said first insulation layer is used as a mask and said oxidation enhancing impurities are injected in a direction at an angle with respect to a direction perpendicular to the surface of said semiconductor substrate.

3. A method for fabricating a MOSFET as recited in claim 1, wherein said step of injecting oxidation enhancing impurities comprises the steps of:

forming a resist over said first insulation layer;

forming an opening in the resist in a region above said trench; and injecting said oxidation enhancing impurities in a direction at an angle with respect to a direction perpendicular to the surface of said semiconductor substrate.

4. A method for fabricating a MOSFET as recited in claim 1, wherein said oxidation enhancing impurities are one type of element or consist of two or more types of elements selected from a group comprising argon, silicon and halogen.

5. A method for fabricating a MOSFET as recited in claim 1, wherein said method includes:

a step of forming a third insulation layer after said step of forming a trench and before said step of injecting oxidation enhancing impurities; and a step of removing said third insulation layer after said step of injecting oxidation enhancing impurities and before said step of forming a second insulation layer.

6. A method for fabricating a MOSFET as recited in claim 1, wherein said step of forming a gate electrode comprises the steps of:

forming a conductive layer over said first insulation layer and inside said trench; and removing said conductive layer formed over said first insulation layer.

7. A method for fabricating a MOSFET as recited in claim 1, wherein said gate electrode is one type of film or a laminated film consisting of two or more types of film selected from a group comprising a metal film, polycrystalline silicon film, suicide film and SiGe film.

8. A method for fabricating a MOSFET as recited in claim 1, wherein said first insulation layer is a lamination of a plurality of layers of insulation film.

* * * * *